United States Patent
Bahr et al.

(10) Patent No.: US 11,722,096 B2
(45) Date of Patent: Aug. 8, 2023

(54) OVEN CONTROLLED MEMS OSCILLATOR WITH MULTIPLE TEMPERATURE CONTROL LOOPS

(71) Applicant: TEXAS INSTRUMENTS INCORPORATED, Dallas, TX (US)

(72) Inventors: Bichoy Bahr, Allen, TX (US); Baher Haroun, Allen, TX (US); Swaminathan Sankaran, Allen, TX (US); Argyrios Dellis, McKinney, TX (US); Sachin Kalia, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/490,223

(22) Filed: Sep. 30, 2021

(65) Prior Publication Data
US 2023/0094448 A1 Mar. 30, 2023

(51) Int. Cl.
| | |
|---|---|
| *H03L 1/04* | (2006.01) |
| *H03H 9/08* | (2006.01) |
| *H03B 1/02* | (2006.01) |
| *H05B 3/06* | (2006.01) |
| *H05B 1/02* | (2006.01) |
| *H03B 5/32* | (2006.01) |
| *H03L 1/02* | (2006.01) |
| *H03H 9/05* | (2006.01) |

(52) U.S. Cl.
CPC ............ *H03B 1/02* (2013.01); *H03B 5/326* (2013.01); *H03H 9/0504* (2013.01); *H03H 9/08* (2013.01); *H03L 1/028* (2013.01); *H03L 1/04* (2013.01); *H05B 1/023* (2013.01); *H05B 3/06* (2013.01)

(58) Field of Classification Search
CPC ... H03B 1/02; H03B 5/30; H03B 5/32; H03B 5/326; H03B 5/36; H03L 1/02; H03L 1/028; H03L 1/04; H03H 9/0504; H03H 9/08; H03H 9/1007; H03H 9/1014; H03H 9/1021
See application file for complete search history.

(56) References Cited

U.S. PATENT DOCUMENTS

| | | | |
|---|---|---|---|
| 6,621,361 B1* | 9/2003 | Fry | H03L 1/04 331/158 |
| 2006/0192626 A1* | 8/2006 | Milliren | H03L 1/04 331/158 |
| 2007/0052327 A1* | 3/2007 | Vilander | H03H 9/02834 310/343 |
| 2008/0315962 A1* | 12/2008 | Anderson | H03L 1/04 331/69 |
| 2009/0219101 A1* | 9/2009 | Stolpman | H03L 1/04 331/70 |
| 2017/0040942 A1* | 2/2017 | Isohata | H03L 1/022 |
| 2017/0373637 A1* | 12/2017 | Kondo | H03H 9/08 |

* cited by examiner

*Primary Examiner* — Levi Gannon
(74) *Attorney, Agent, or Firm* — Valerie M. Davis; Frank D. Cimino

(57) ABSTRACT

In an example, a system includes a BAW resonator. The system also includes a first heater configured to heat the BAW resonator, where the first heater is controlled by a first control loop. The system includes a circuit coupled to the BAW resonator. The system also includes a second heater configured to heat the circuit, where the second heater is controlled by a second control loop.

13 Claims, 3 Drawing Sheets

OVEN CONTROLLED MEMS OSCILLATOR WITH MULTIPLE TEMPERATURE CONTROL LOOPS

BACKGROUND

Bulk acoustic wave (BAW) resonator technology enables the integration of high-precision and low-jitter clocks directly into packages that contain other circuits. BAW technology is less bulky than external quartz crystals external to the package. BAW technology creates integrated micro-electromechanical (MEMS)-based on-chip resonators that include a piezoelectric material sandwiched between two electrodes. This piezoelectric material can convert electrical energy to mechanical-acoustical energy, producing reliable oscillations that result in a high-frequency, stable clock output.

SUMMARY

In accordance with at least one example of the description, a system includes a BAW resonator. The system also includes a first heater configured to heat the BAW resonator, where the first heater is controlled by a first control loop. The system includes a circuit coupled to the BAW resonator. The system also includes a second heater configured to heat the circuit, where the second heater is controlled by a second control loop.

In accordance with at least one example of the description, a system includes a BAW resonator on a BAW die. The system also includes a first heater configured to heat the BAW resonator, where the first heater is a resistive heater configured to be controlled by a first control loop. The system includes a circuit coupled to the BAW resonator. The system also includes a second heater configured to heat the circuit, where the second heater is configured to be controlled by a second control loop. The system includes a third heater configured to heat the BAW die, where the third heater is configured to be controlled by a third control loop.

In accordance with at least one example of the description, a system includes a BAW resonator on a BAW die. The system also includes a first heater configured to heat the BAW resonator, where the first heater is configured to be controlled by a first control loop, and the BAW resonator and the first heater are located on a cantilevered anchor attached to the BAW die. The system includes a circuit coupled to the BAW resonator. The system also includes a second heater configured to heat the circuit and the BAW die, where the second heater is configured to be controlled by a second control loop.

DETAILED DESCRIPTION

Figure 1A:
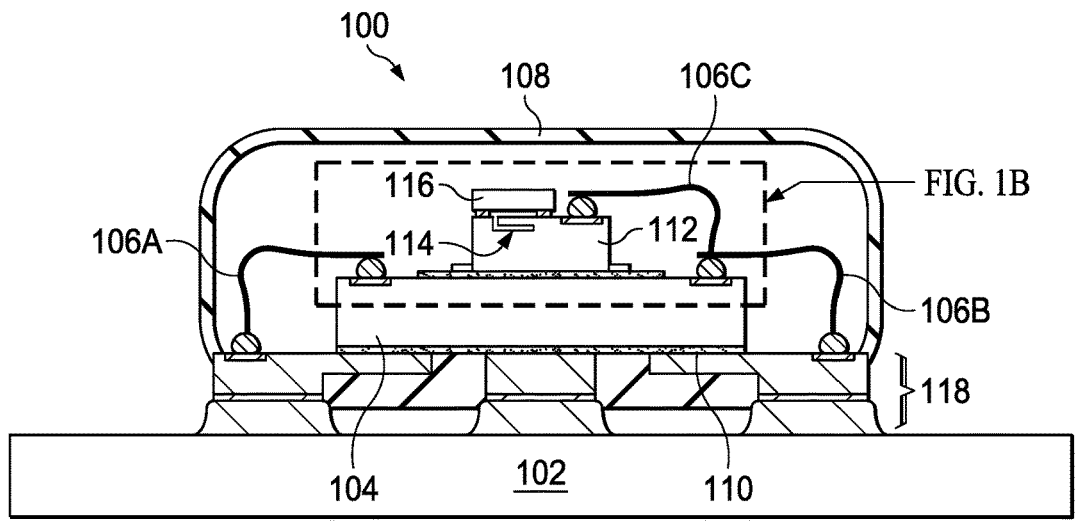
FIG. 1A is a diagram of a BAW resonator package in accordance with various examples.

Many electronic devices use crystal oscillators to provide clock signals for electronic circuits. Crystals usually have temperature dependencies. If the ambient temperature of the crystal changes, the crystal may change its frequency. Also, temperature change for sustaining oscillator circuitry on a silicon chip results in frequency change of the overall oscillator. To maintain a stable output frequency of the oscillator across ambient temperature, both the crystal and the circuit are often maintained at a stable temperature. To maintain the crystal at a stable temperature, an oven-controlled crystal oscillator (OCXO) is useful. The oven is an insulated, temperature-controlled chamber used to maintain the crystal at a constant temperature. A heater may heat the crystal and other components, such as a silicon chip. To control temperature, many OCXO solutions use a single temperature control loop. A single temperature sensor measures temperature, and the control loop adjusts power to the heater to maintain a fixed temperature.

With one temperature sensor and one heater, temperature gradients and temperature variation may occur within the semiconductor package. Even if the heater is placed strategically between the crystal and other components, outside ambient temperatures could cause a temperature gradient, and temperature fluctuations could affect the frequency of the oscillator, through both the circuitry and crystal. The temperature of the crystal and the temperature of the other component may fluctuate, reducing the accuracy of the crystal and the operation of the circuit. Also, OCXOs are often large, may have problems providing a stable frequency, and may increase power consumption.

In examples herein, a BAW resonator with a heater provides accurate and stable clock signals. BAW resonators may be manufactured to be thin, such as thinner than 10 microns. A device this thin has almost no vertical temperature gradient throughout the thickness of the device. The BAW resonator may be manufactured with a small anchor that is attached to a die, with nothing else around the resonator. The resonator therefore is cantilevered and "floats" on a cantilevered anchor above the die on an island. A heater may be integrated with the resonator. This structure allows the temperature of the heater and the BAW resonator to be raised high with less power consumption due to the increased thermal resistance of the thin anchor. The BAW resonator may be heated individually rather than heating the entire package, which reduces power consumption compared to a conventional OCXO. In examples herein, the heater is also useful as a temperature sensor. In another example described herein, a second heater may be useful to heat a circuit on a die, rather than heating the entire die itself. The heater for the resonator and the heater for the circuit may have independent control loops. In another example, a third heater may heat the BAW die itself (to control thermal gradients). In yet another example, a first heater may heat the BAW resonator while a second heater heats both the BAW die and the circuit.

In examples herein, the temperature of a BAW resonator may be precisely maintained, providing improved stability for the resonator. A BAW resonator may be maintained at a different temperature than other components in a device, providing improved performance for both the resonator and the other components. Also, power consumption may be reduced by maintaining different components at different temperatures using independent temperature control loops.

The same reference numbers or other reference designators are used in the drawings to designate the same or similar (functionally and/or structurally) features.

FIG. 1A is a diagram of a BAW resonator package 100 in accordance with various examples herein. Package 100 includes a printed circuit board (PCB) 102, a complementary metal-oxide semiconductor (CMOS) die 104, bond lines 106A, 106B, and 106C (collectively, bond lines 106), and thermally insulating cap 108. Package 100 also includes a thermally insulating die attach 110, a BAW die 112, a BAW resonator and heater 114, a wafer-level encapsulation (WLE) cap 116, and device structures 118. In this example, CMOS die 104 resides on PCB 102, with a thermally insulating die attach 110 between CMOS die 104 and device structures 118.

Bond lines 106A, 106B, and 106C are examples, and more or fewer bond lines 106 may be present in other examples. Thermally insulating cap 108 provides thermal insulation to keep heat within package 100 and reduce power consumption. Thermally insulating die attach 110 provides thermal insulation on a side of CMOS die 104. BAW resonator and heater 114 resides on BAW die 112. The heater of BAW resonator and heater 114 are configured to heat the BAW resonator by radiating heat. In this example, BAW resonator and heater 114 is anchored to BAW die 112 on one end and is therefore cantilevered underneath WLE cap 116 as shown in FIG. 1A. BAW resonator and heater 114 are integrated into one component in this example. The BAW resonator is thin, such as less than 10 microns of thickness, and the heater is integrated with the resonator. Because the BAW resonator and heater 114 is cantilevered and anchored to BAW die 112 on one end, BAW resonator and heater 114 is thermally isolated and its temperature can be raised with relatively little power. This structure provides for lower power consumption than conventional systems. The BAW resonator is heated with the heater separate from the other components of package 100. Heating the BAW resonator separately also reduces power consumption compared to conventional systems.

In examples herein, the heater of BAW resonator and heater 114 may also be used as a temperature sensor. The heater may be a resistor or resistive material. A known current is provided to the resistor, which causes the resistor to radiate heat. A voltage across the resistor is measured to determine the value of the resistance. The resistance is proportional to temperature, so the value of the resistance provides the temperature. A control circuit for the heater that may also be used to determine temperature is described below.

Figure 1B:
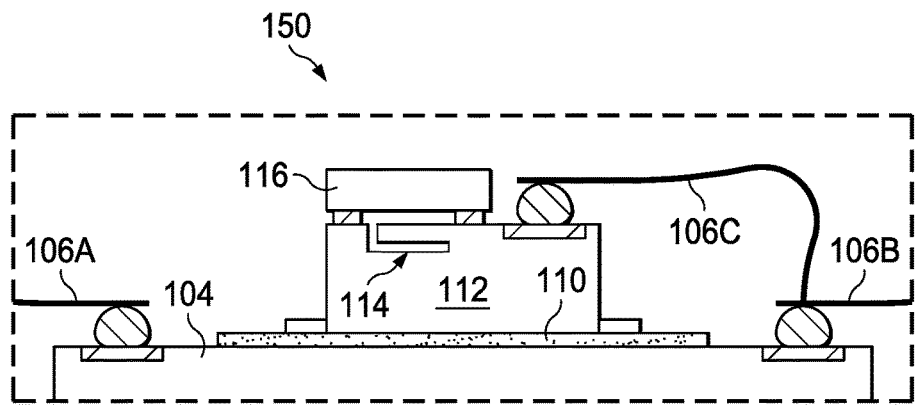
FIG. 1B is a diagram of a close-up view of a BAW resonator in accordance with various examples.

FIG. 1B is a close-up view 150 of some of the components of FIG. 1A in accordance with various examples herein. FIG. 1B includes CMOS die 104, bond lines 106, thermally insulating die attach 110, BAW die 112, BAW resonator and heater 114, and WLE cap 116. FIG. 1B shows the structure of BAW die 112 and BAW resonator and heater 114 in greater detail. In FIG. 1B, the cantilevered BAW resonator and heater 114 is shown underneath WLE cap 116. Space is shown below cantilevered BAW resonator and heater 114 and above BAW die 112 to indicate that BAW resonator and heater 114 are floating and anchored to a portion of BAW die 112. BAW resonator and heater 114 may be integrated within an enclosed structure, which allows the temperature of the resonator to be raised via the heater with low power consumption. A small portion of BAW die 112 is therefore heated to control the temperature of the resonator, rather than heating the entire BAW die 112 or the entire package 100.

Figure 2:
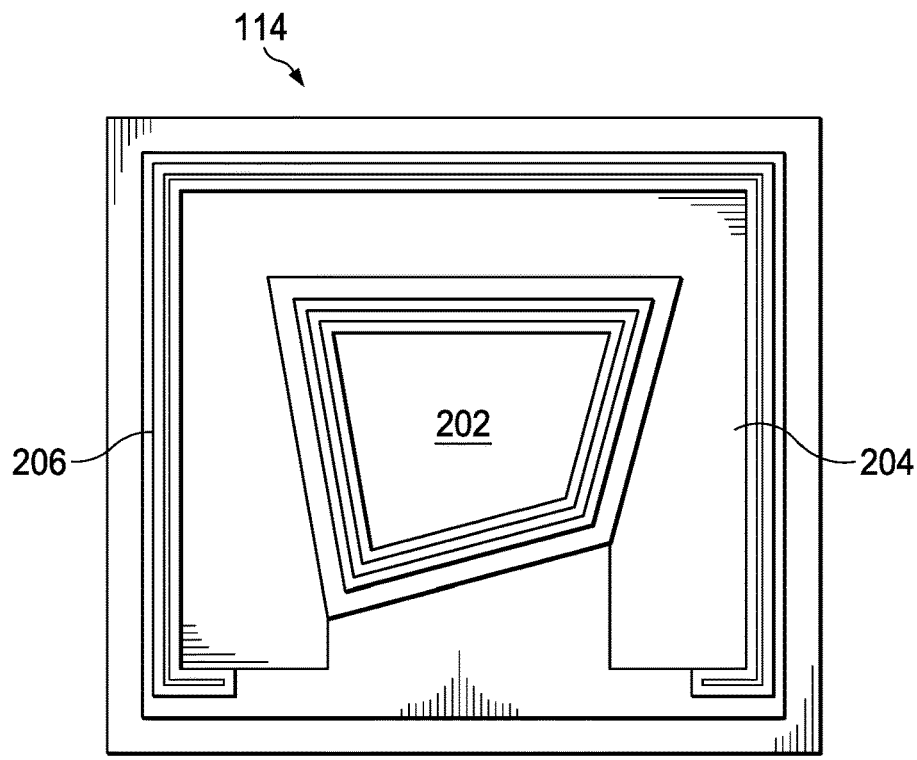
FIG. 2 is a diagram of a BAW resonator and heater in accordance with various examples.

FIG. 2 is another view of a BAW resonator and heater 114 in accordance with various examples herein. BAW resonator and heater 114 includes BAW resonator 202, heater 204, and isolation trench 206. BAW resonator and heater 114 in FIG. 2 is an example structure, and the BAW resonator and heater 114 may have other shapes, sizes, or layouts in other examples. The BAW resonator 202 is a thin device as described above. Therefore, there is little to no temperature gradient throughout the thickness of the BAW resonator 202. Heater 204 is in proximity to BAW resonator 202 and is situated around BAW resonator 202 in this example, enclosing BAW resonator 202 on three sides. Heater 204 may completely surround BAW resonator 202 in other examples, or may only partially surround BAW resonator 202. An isolation trench 206 may provide isolation for heater 204 from other components. The proximity of heater 204 to BAW resonator 202 allows heater 204 to efficiently heat BAW resonator 202 and help maintain BAW resonator 202 at a stable and suitable operating temperature.

Heater 204 may be a resistor or material that forms a resistive heater as described above. Heater 204 may be configured to produce heat by passing current through heater 204. Heater 204 may also be a temperature sensor. Circuitry, described below, may measure a voltage at heater 204 to determine the resistance of heater 204. If heater 204 has a resistance that is proportional to temperature, the value of the resistance is useful to calculate the temperature value. A control loop may regulate the temperature of the heater 204.

In this example, heater 204 heats BAW resonator 202 without heating other portions of BAW die 112 or package 100. In some examples, the BAW resonator 202 may be heated to a relatively high temperature, such as at least 125° Celsius (C). The CMOS die 104 may be at a lower temperature, such as 500 or 60° C. Using a separate heater 204 for BAW resonator 202 allows BAW resonator 202 to be at a much higher temperature than CMOS die 104, rather than heating CMOS die 104 to the higher temperature as well, which reduces power consumption.

Figure 3:
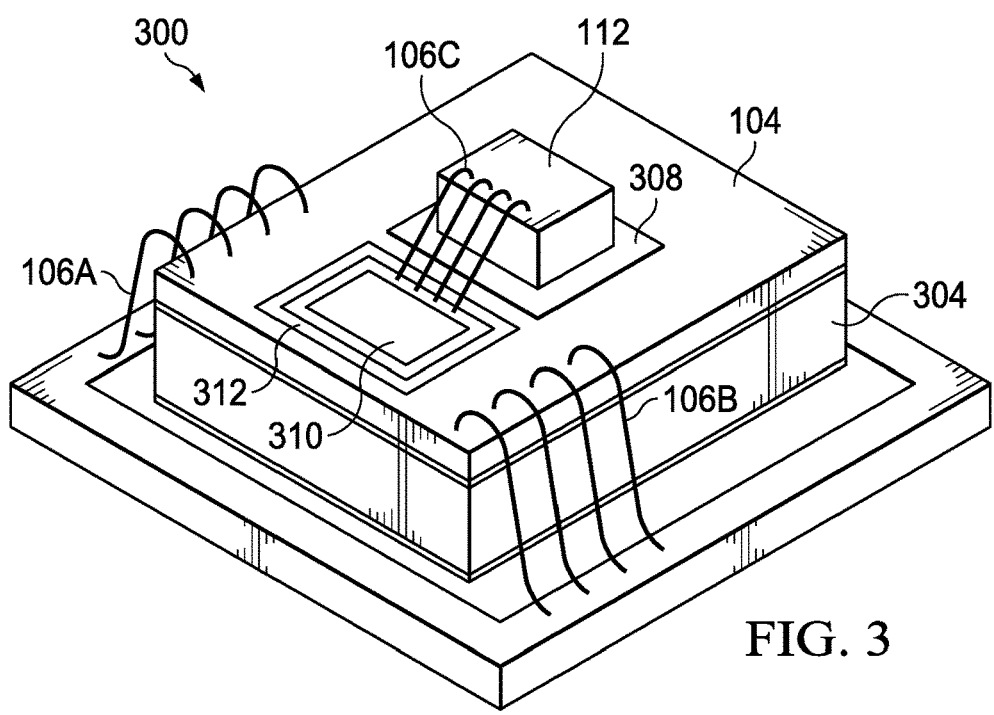
FIG. 3 is a diagram of a system for an oscillator circuit with multiple temperature control loops in accordance with various examples.

FIG. 3 is a diagram of a system 300 for an oscillator circuit with multiple temperature control loops in accordance with various examples herein. FIG. 3 includes some components described above with respect to FIGS. 1A and 1, and like numerals denote like components. System 300 includes a CMOS die 104, bond lines 106, BAW die 112, thermal insulation 304, BAW die heater 308, CMOS circuit 310, and CMOS heater 312. Thermal insulation 304 reduces heat conduction between CMOS die 104 and other circuit components.

System 300 shows an example with a first heater (BAW die heater 308) for BAW die 112 and a second heater (CMOS heater 312) for CMOS circuit 310. Also, a third heater for the BAW resonator is found within BAW die 112 (not shown in FIG. 3 for simplicity). The third heater is the heater described above with respect to FIG. 1A (BAW resonator and heater 114, found inside a WLE cap 116). Therefore, system 300 has three heaters and three independent control loops, one for each heater.

In some examples, stability of the system 300 is improved if the BAW die 112 is at a stable and suitable operating temperature, and also if the CMOS circuit 310 is at a stable and suitable operating temperature. Because these temperatures may be different, separate heaters with separate control loops are used. The first heater (BAW die heater 308) is configured to heat only the BAW die 112. This heater helps to prevent a temperature gradient beneath BAW die 112. The second heater (CMOS heater 312) is configured to heat only the CMOS circuit 310, but not the entire CMOS die 104. CMOS heater 312 is shown in FIG. 3 as a series of lines surrounding CMOS circuit 310, but CMOS heater 312 may be any suitable size, shape, or structure in other examples. By only heating CMOS circuit 310 and not heating the entire CMOS die 104, power consumption is reduced. Because excessive heat may degrade certain circuit components, heating only certain portions of system 300 increases the lifespan and reliability of components that are not heated. Also, BAW die 112 may be heated to a higher temperature than other components, without heating other components of system 300. Independent control loops are useful for the separate heaters to keep the heaters at a programmed temperature. Power consumption may be reduced and performance of the circuit may be increased by using separate temperature control loops. Therefore, system 300 is an example system with three heaters and three control loops.

Figure 4:
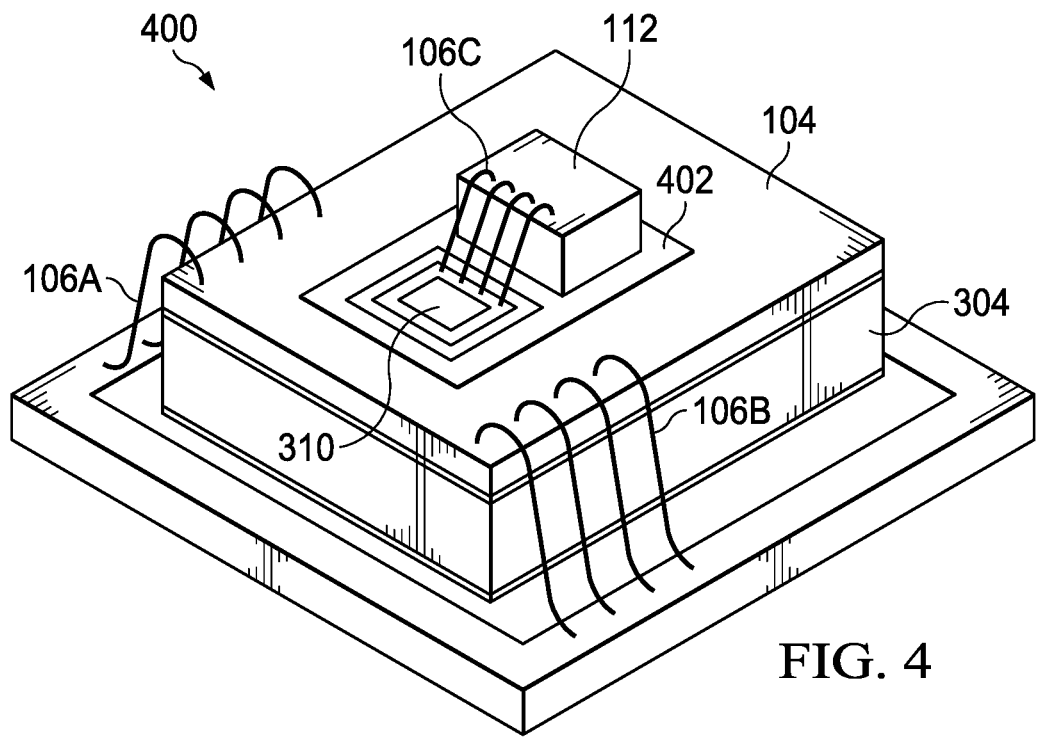
FIG. 4 is a diagram of a system for an oscillator circuit with multiple temperature control loops in accordance with various examples.

FIG. 4 is a diagram of a system 400 for an oscillator circuit with multiple temperature control loops in accordance with various examples herein. FIG. 4 includes some components described above with respect to FIGS. 1A, 1B and 3, and like numerals denote like components. System 400 includes a CMOS die 104, bond lines 106, BAW die 112, thermal insulation 304, CMOS circuit 310, and heater 402.

In system 400, heater 402 is located close to both BAW die 112 and CMOS circuit 310. In this example, heater 402 is underneath BAW die 112 and CMOS circuit 310, relative to CMOS die 104. Heater 402 is a first heater that heats both BAW die 112 and CMOS circuit 310 in this example. As described with respect to FIG. 3 above, a second heater for the BAW resonator is found within BAW die 112 (not shown in FIG. 4 for simplicity). The second heater is the heater described above with respect to FIG. 1A (BAW resonator and heater 114, found inside a WLE cap 116). Therefore, system 400 has two heaters and two independent control loops, one for each heater.

In this example, heater 402 is shown as extending underneath BAW die 112 and CMOS circuit 310. Heater 402 may be any suitable size, shape, or structure in other examples. Heater 402 heats both BAW die 112 and CMOS circuit 310 to a suitable operating temperature. The second heater for the BAW resonator (not shown in FIG. 4) may heat the BAW resonator to a higher temperature than heater 402. Using separate heaters with separate independent temperature control loops allows for different parts of system 400 to be heated to different temperatures, and reduces power consumption as the entire system 400 does not have to be heated to the high temperature of the BAW resonator. Also, as described above, heater 402 is used to heat only BAW die 112 and CMOS circuit 310, rather than the entire CMOS die 104.

Figure 5:
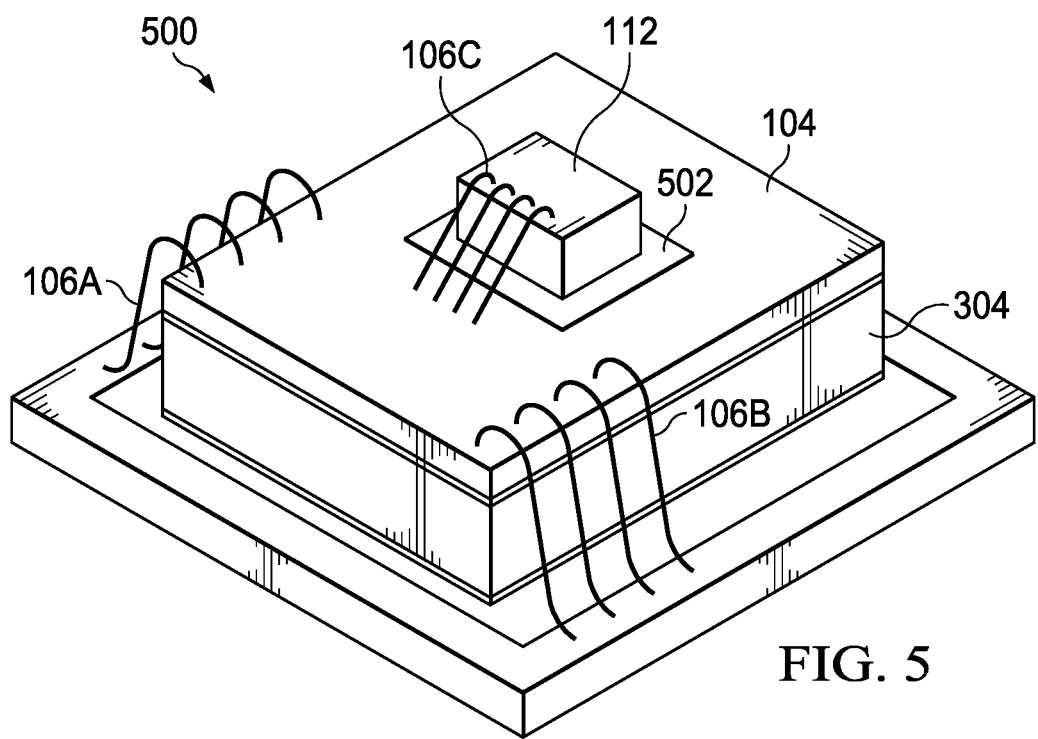
FIG. 5 is a diagram of a system for an oscillator circuit with multiple temperature control loops in accordance with various examples.

FIG. 5 is a diagram of a system 500 for an oscillator circuit with multiple temperature control loops in accordance with various examples herein. FIG. 5 includes some components described above with respect to FIGS. 1A, 1B and 3, and like numerals denote like components. System 500 includes a CMOS die 104, bond lines 106, BAW die 112, thermal insulation 304, and heater and circuitry 502.

In system 500, BAW die 112 is near heater and circuitry 502. As described with respect to FIG. 3 above, a second heater for the BAW resonator is found within BAW die 112 (not shown in FIG. 5 for simplicity). The second heater is the heater described above with respect to FIG. 1A (BAW resonator and heater 114, found inside a WLE cap 116). Heater and circuitry 502 includes a first heater and CMOS circuitry, shown here as a single component situated on CMOS die 104 below BAW die 112. In this example, CMOS circuitry (such as CMOS circuit 310 described above) and a heater are both underneath BAW die 112, and are represented by heater and circuitry 502. FIG. 5 shows that a single heater is useful to heat both BAW die 112 and CMOS circuitry, and the single heater and CMOS circuitry may be located underneath BAW die 112. Bond lines 106C may couple BAW die 112 to the CMOS circuitry underneath BAW die 112. In this example, the BAW resonator on BAW die 112 uses a first independent control loop, and the heater and circuitry 502 uses a second independent control loop. In another example, the heater may be between BAW die 112 and the CMOS circuitry.

FIGS. 3, 4 and 5 show that the structure and layout of BAW die 112, CMOS circuit 310, and the different heaters may vary in some examples. The structures and layouts in FIGS. 3, 4 and 5 are merely examples, and other structures and layouts are useful in other examples. BAW die 112 and CMOS circuit 310 may have separate heaters or may share a heater. The BAW resonator on BAW die 112 may have a separate heater, as the BAW resonator often operates at a higher temperature than other circuit components.

In some examples herein, bond lines 106 may be placed away from any heaters present in the systems, such as heaters in the CMOS die 104. The bond lines 106 may be placed on the CMOS die 104 farthest from the heaters in some examples, such as on an edge of the CMOS die 104. As one example, the edges of the die 104 may have lower temperatures than interior portions of the die where the heaters are located. The bond lines 106 may be placed in these areas of lower temperatures in these examples.

Figure 6:
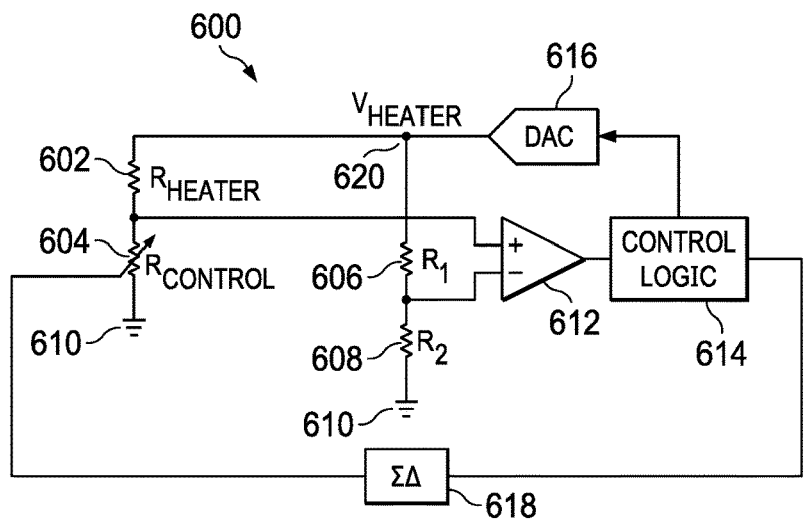
FIG. 6 is a circuit diagram of a heater control circuit in accordance with various examples.

FIG. 6 is a circuit diagram of a heater control circuit 600 in accordance with various examples herein. Heater control circuit 600 includes four resistors ($R_{heater}$ 602, $R_{control}$ 604, $R_1$ 606, $R_2$ 608), ground 610, comparator 612, control logic 614, digital to analog converter (DAC) 616, sigma-delta block 618, and $V_{heater}$ node 620. Heater control circuit 600 is one example of a control circuit used to control a heater to provide a programmed temperature in accordance with the systems described above. Any type of heater control circuit 600 is useful in other examples. Other types of suitable heater control circuits 600 may be analog, digital, or a combination of the two.

Heater control circuit 600 uses a resistive impedance bridge to balance the circuit at a programmed temperature. $R_{heater}$ 602 is a resistor that changes resistance as the temperature changes at a known rate. For example, the resistance of $R_{heater}$ 602 may change linearly with temperature. As more current passes through $R_{heater}$ 602, $R_{heater}$ 602 heats up and changes resistance. At a specific programmed temperature, $R_{heater}$ 602 reaches a resistance that balances the bridge of heater control circuit 600. The bridge is balanced if the ratio between $R_{heater}$ 602 and $R_{control}$ 604 is the same as the ratio between $R_1$ 606 and $R_2$ 608. If the bridge is balanced, the inputs to comparator 612 are the same and control logic 614 stops adjusting the voltage at $V_{heater}$ node 620, which provides the current to $R_{heater}$ 602. For a given current in $R_{heater}$ 602, $R_{heater}$ 602 dissipates a specific amount of power and heats up to a specific constant temperature, given that the ambient temperature is constant. The heater control circuit 600 then remains at a steady state until the ambient temperature fluctuates and further balancing is performed.

In some examples, $R_{control}$ 604, $R_1$ 606, and $R_2$ 608 have much lower temperature dependencies than $R_{heater}$ 602. A resistor's temperature coefficient of resistance (TCR) indicates how much the resistance value changes as temperature changes. The TCR is expressed in parts per million per degree C. (ppm/° C.). In one example, the TCR of $R_{heater}$ 602 may be approximately 2600 ppm/° C. Therefore, as temperature changes, $R_{heater}$ 602 may change resistance considerably, while $R_{control}$ 604, $R_1$ 606, and $R_2$ 608 remain more stable.

$R_{control}$ 604 allows heater control circuit 600 to be tuned to a specific temperature. $R_{control}$ 604 is set to a resistance that results in a programmed operating temperature for the heater if $R_{heater}$ 602 equals $R_{control}$ 604, This type of heater control circuit 600 could be used for any of the heaters described herein.

In the examples described herein, the temperature of a BAW resonator may be precisely maintained by using a heater and a heater control loop, providing improved stability for the BAW resonator. By using multiple heaters, a BAW resonator may be maintained at a different temperature than other components in a device, providing improved performance for both the resonator and the other components. Also, power consumption may be reduced by maintaining different components at different temperatures using independent temperature control loops, rather than maintaining different components at the same temperature.

The term "couple" is used throughout this description. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
   a bulk acoustic wave (BAW) resonator;
   a BAW die;
   a first heater configured to heat the BAW resonator, wherein the first heater is controlled by a first control loop;
   a circuit coupled to the BAW resonator; and
   a second heater configured to heat the circuit, wherein the second heater is controlled by a second control loop,
   wherein the BAW resonator and the first heater are directly coupled to each other and anchored to a portion of the BAW die such that the BAW resonator is spaced from the BAW die and the first heater partially encloses the BAW die.

2. The system of claim 1, wherein the first heater is a resistive heater, and the resistive heater is configured to provide a temperature value to the first control loop.

3. The system of claim 1, wherein the second heater is a resistive heater, and the resistive heater is configured to provide a temperature value to the second control loop.

4. The system of claim 1, wherein the circuit is an oscillator circuit, and the second heater is a heater within a complementary metal-oxide semiconductor (CMOS) die.

5. The system of claim 4, wherein the first heater is configured to heat the BAW resonator to a temperature higher than the CMOS die.

6. The system of claim 4, wherein one or more bond lines coupled to the CMOS die are spaced on the CMOS die on an edge farthest from the second heater.

7. A system, comprising:
   a bulk acoustic wave (BAW) resonator on a BAW die;
   a first heater configured to heat the BAW resonator, wherein the first heater is a resistive heater configured to be controlled by a first control loop;
   a circuit die;
   a circuit on the circuit die and coupled to the BAW resonator;
   a second heater configured to heat the circuit, wherein the second heater is configured to be controlled by a second control loop; and
   a third heater disposed between the circuit die and the BAW resonator and configured to heat the BAW die, wherein the third heater is configured to be controlled by a third control loop.

8. The system of claim 7, wherein the first heater is a resistive heater, and the resistive heater is configured to provide a temperature value to the first control loop.

9. The system of claim 7, wherein the circuit is an oscillator circuit, and the second heater is a heater within a complementary metal-oxide semiconductor (CMOS) die.

10. The system of claim 7, wherein the third heater is a heater within a CMOS die.

11. The system of claim 7, wherein the first control loop, the second control loop, and the third control loop are independent control loops.

12. A system, comprising:
- a bulk acoustic wave (BAW) resonator on a BAW die;
- a first heater configured to heat the BAW resonator, wherein the first heater is a resistive heater configured to be controlled by a first control loop;
- a circuit coupled to the BAW resonator;
- a second heater configured to heat the circuit, wherein the second heater is configured to be controlled by a second control loop; and
- a third heater configured to heat the BAW die, wherein the third heater is configured to be controlled by a third control loop,
- wherein the BAW resonator and the first heater are located on a cantilevered anchor attached to the BAW die.

13. A system comprising:
- a bulk acoustic wave (BAW) resonator;
- a BAW die;
- a first heater configured to heat the BAW resonator, wherein the first heater is controlled by a first control loop;
- a circuit coupled to the BAW resonator; and
- a second heater configured to heat the circuit, wherein the second heater is controlled by a second control loop,
- wherein the BAW resonator and the first heater are directly coupled to each other and anchored to a portion of the BAW die, and wherein the BAW resonator and the first heater are a single integrated component that also includes an isolation trench configured to thermally isolate the first heater from other components of the system.

* * * * *